United States Patent
Yokoyama et al.

(10) Patent No.: US 8,839,502 B2
(45) Date of Patent: Sep. 23, 2014

(54) PRODUCTION METHOD OF ELECTRONIC COMPONENT

(75) Inventors: Tsuyoshi Yokoyama, Tokyo (JP); Kazunori Inoue, Tokyo (JP); Kazuhiro Matsumoto, Tokyo (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 0 days.

(21) Appl. No.: 13/565,150

(22) Filed: Aug. 2, 2012

(65) Prior Publication Data

US 2012/0299665 A1    Nov. 29, 2012

Related U.S. Application Data

(63) Continuation of application No. PCT/JP2011/052987, filed on Feb. 14, 2011.

(30) Foreign Application Priority Data

Feb. 16, 2010  (JP) ................................. 2010-031726

(51) Int. Cl.
*H04R 31/00* (2006.01)
*H03H 9/05* (2006.01)
*H03H 9/10* (2006.01)

(52) U.S. Cl.
CPC .............. *H03H 9/1092* (2013.01); *H03H 9/059* (2013.01); *H03H 9/1085* (2013.01)
USPC ................ 29/594; 29/609.1; 29/833; 156/60; 156/247; 333/133; 361/233; 361/234

(58) Field of Classification Search
USPC ............. 29/592.1, 594, 609.1, 833, 834, 836; 333/133; 156/60, 247; 361/233, 234
See application file for complete search history.

(56) References Cited

U.S. PATENT DOCUMENTS

| | | | |
|---|---|---|---|
| 5,920,142 A | 7/1999 | Onishi et al. | |
| 6,423,446 B1 * | 7/2002 | Miyazaki et al. | 429/209 |
| 2004/0145278 A1 | 7/2004 | Iwamoto | |

FOREIGN PATENT DOCUMENTS

| | | | |
|---|---|---|---|
| JP | 10-163798 A | | 6/1998 |
| JP | 10-270975 A | | 10/1998 |
| JP | 2001-185976 A | | 7/2001 |
| JP | 2003-264258 A | | 9/2003 |
| JP | 2004-248243 A | | 9/2004 |
| JP | 2005-175345 A | | 6/2005 |
| JP | 2005153092 A | * | 6/2005 |
| JP | 2005-268297 A | | 9/2005 |
| JP | 2005-285864 A | | 10/2005 |

(Continued)

OTHER PUBLICATIONS

Written Opinion (PCT/ISA/237) issued in PCT/JP2011/052987 mailed in Apr. 2011.

(Continued)

*Primary Examiner* — Paul D Kim
(74) *Attorney, Agent, or Firm* — Chen Yoshimura LLP

(57) ABSTRACT

A production method of an electronic component includes: forming a sheet having a resin layer and a metal layer formed under the resin layer; bonding the sheet to a substrate so that the metal layer is arranged on a functional portion of an acoustic wave element formed on the substrate, a frame portion surrounding the functional portion is formed between the metal layer and the substrate, a cavity is formed on the functional portion by the metal layer and the frame portion, and the resin layer covers the metal layer and the frame portion.

7 Claims, 11 Drawing Sheets

(56) References Cited

FOREIGN PATENT DOCUMENTS

| | | |
|---|---|---|
| JP | 2006-128809 A | 5/2006 |
| JP | 2007-180919 A | 7/2007 |
| JP | 2008-124784 A | 5/2008 |
| JP | 2008-227748 A | 9/2008 |

OTHER PUBLICATIONS

International Search Report (ISR) issued in PCT/JP2011/052987 mailed in Apr. 2011.

Japanese Office Action dated Jun. 18, 2013, in a counterpart Japanese patent application No. 2010-031726.

* cited by examiner

PRODUCTION METHOD OF ELECTRONIC COMPONENT

CROSS-REFERENCE TO RELATED APPLICATION

This application is a continuation application of PCT/JP2011/052987 filed on Feb. 14, 2011, which claims priority to Japanese Patent Application No. 2010-031726 filed on Feb. 16, 2010, the contents of which are herein wholly incorporated by reference.

FIELD

A certain aspect of the present invention relates to an electronic component and a production method thereof, and relates to, for example, an electronic component in which an acoustic wave element is sealed by a resin layer and a production method thereof.

BACKGROUND

An acoustic wave device is used as a filter or a duplexer of a mobile communication unit. An acoustic wave element such as a surface acoustic wave element or a thin-film piezoelectric resonance element is used as the acoustic wave device. In order to downsize the acoustic wave device, a substrate on which an acoustic wave element is formed is sealed by a resin. When the acoustic wave element is sealed by the resin, a cavity is formed on a functional portion of the acoustic wave element. The functional portion of the acoustic wave element is an electrode such as an IDT (Interdigital Transducer) in the case of the surface acoustic wave element, and is an overlapping portion of an upper electrode and a lower electrode sandwiching a piezoelectric thin film in the case of the thin-film piezoelectric resonance element.

Japanese Patent Application Publication No. 2008-227748 discloses that a frame is formed on a substrate so as to surround a functional portion of an acoustic wave element, and a roof portion of the frame is formed by a photosensitive resin and a metal layer so that a cavity is formed on the functional portion. Japanese Patent Application Publication No. 2005-175345 discloses that a cavity is formed on a functional portion by bonding a resin sheet, on which a recess portion to be a cavity is formed, to a substrate on which an acoustic wave element is formed.

SUMMARY OF THE INVENTION

According to an aspect of the present invention, there is provided a production method of an electronic component including: forming a sheet having a resin layer and a metal layer formed under the resin layer; bonding the sheet to a substrate so that the metal layer is arranged on a functional portion of an acoustic wave element formed on the substrate, a frame portion surrounding the functional portion is formed between the metal layer and the substrate, a cavity is formed on the functional portion by the metal layer and the frame portion, and the resin layer covers the metal layer and the frame portion.

According to another aspect of the present invention, there is provided an electronic component including: a substrate; an acoustic wave element formed on the substrate; a metal layer formed on an functional portion of the acoustic wave element; a frame portion that includes a thermosetting resin, is formed between the metal layer and the substrate and surrounds the functional portion so that a cavity is formed on the functional portion by the metal layer and the frame portion; and a resin layer that includes a thermoplastic resin and covers the metal layer and the frame portion.

DETAILED DESCRIPTION

With the method of forming a roof portion with use of a photosensitive resin, gas generated from the resin may remain in a cavity. In this case, characteristics of an acoustic wave element may be degraded. With the method of bonding a resin sheet having a recess to a substrate, a resin may be deformed because of pressure applied during modularizing of an acoustic wave device, because a roof portion is the resin.

Figure 3A:
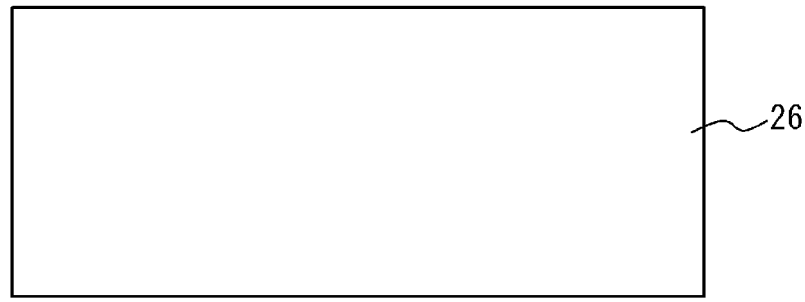
FIG. 3A through FIG. 3C illustrate a top view of the production method of the electronic component in accordance with the first embodiment.
Figure 3B:
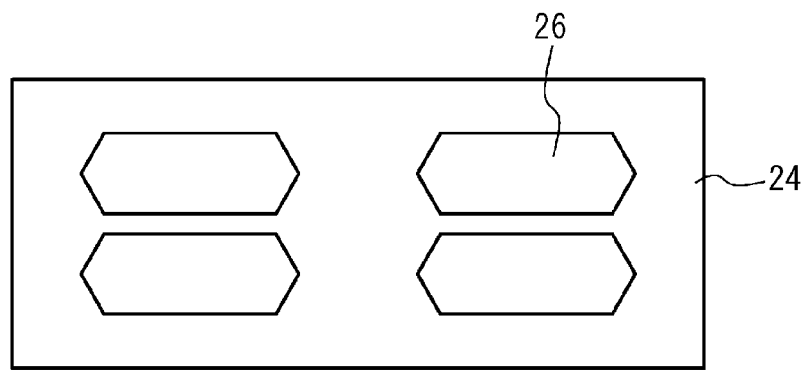
Figure 3C:
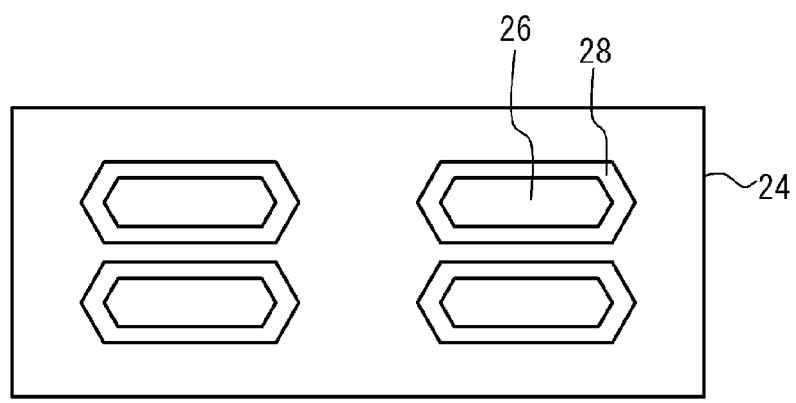
Figure 4A:
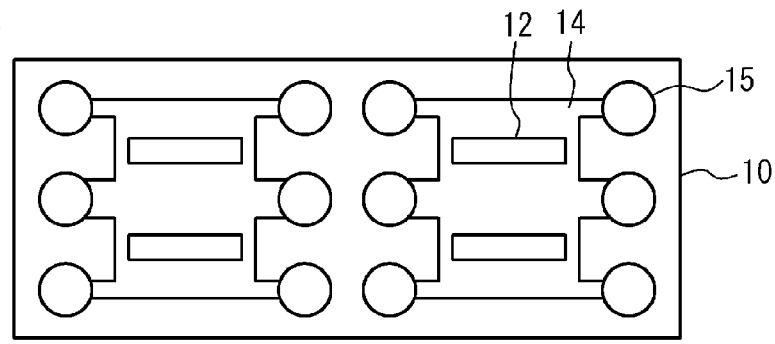
FIG. 4A through FIG. 4C illustrate the top view of the production method of the electronic component in accordance with the first embodiment.
Figure 4B:
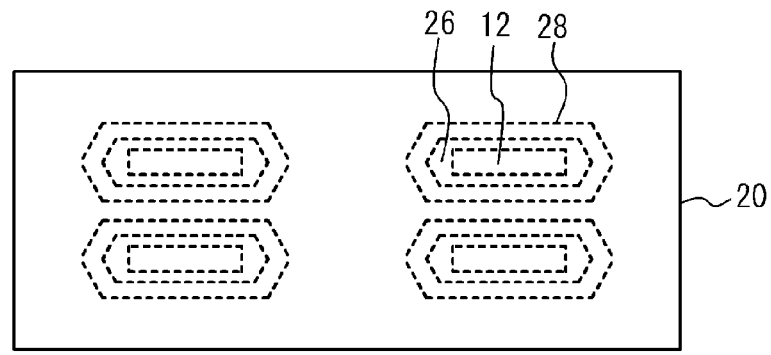
Figure 4C:
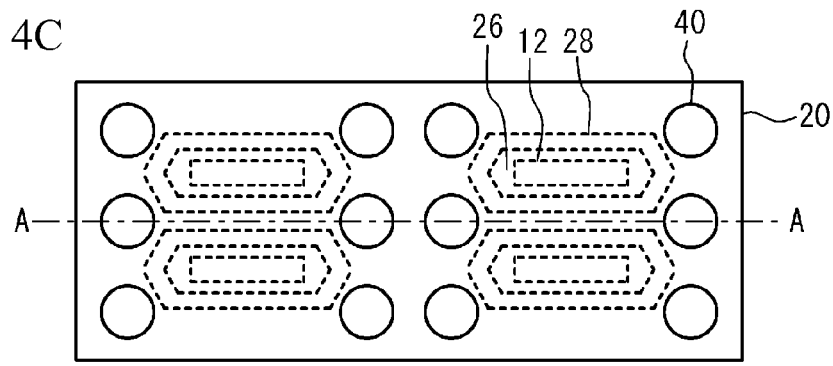

FIG. 1A through FIG. 2E illustrate a cross sectional view of a production method of an electronic component in accordance with a first embodiment and correspond to the cross sectional view taken along an A-A line of FIG. 4C. FIG. 3A through FIG. 4C illustrate a top view of the production method of the electronic component in accordance with the first embodiment. In FIG. 4B and FIG. 4C, a functional portion 12, a metal layer 26 and a frame portion 28 are seen through and are illustrated with a broken line. In FIG. 4A, a sheet 30 is upside down with respect to FIG. 3C.

Figure 1A:
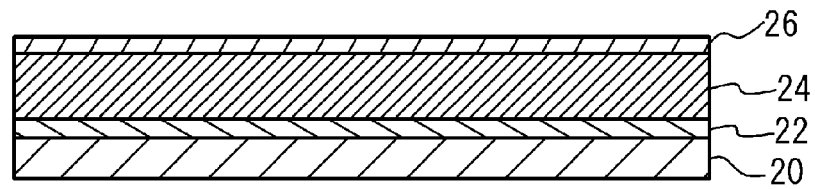
FIG. 1A through FIG. 1C illustrate a cross sectional view of a production method of an electronic component in accordance with a first embodiment.

As illustrated in FIG. 1A and FIG. 3A, a temporary adhesion layer 22, a resin layer 24 and the metal layer 26 are provided on a support layer 20. The support layer 20 is a board supporting the resin layer 24 and the metal layer 26, and is a transparent carrier wafer such as a glass. The temporary adhesion layer 22 is a layer that temporarily bonds the support layer 20 and the resin layer 24, and is made of a material of which adhesive strength is reduced by heat or ultraviolet rays.

A thickness of the temporary adhesion layer 22 is, for example, 10 μm. The resin layer 24 is made of a thermoplastic resin or the like, and is made of thermoplastic polyimide, liquid crystal polymer or the like. A thickness of the resin layer 24 is, for example, approximately 50 μm. The metal layer 26 is a copper foil or the like, and is thermo-compression bonded on the resin layer 24. The metal layer 26 may be another metal. Although a thickness of the metal layer 26 is, for example, 10 μm, the thickness may be designed so that a cavity does not disappear during a modularization because of pressure applied to the metal layer 26 during the modularization of a surface acoustic wave device. And, the metal layer 26 has only to be provided at least on a region to be a cavity 13 in FIG. 4B described later.

Figure 1B:
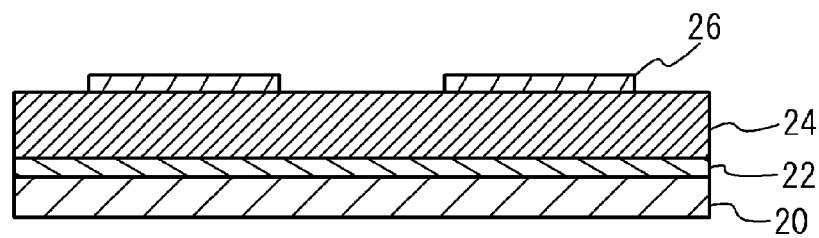

As illustrated in FIG. 1B and FIG. 3B, the metal layer 26 is formed into a predetermined shape by exposure technology and etching technology. Wet etching is used as the etching technology. Dry etching may be used.

Figure 1C:
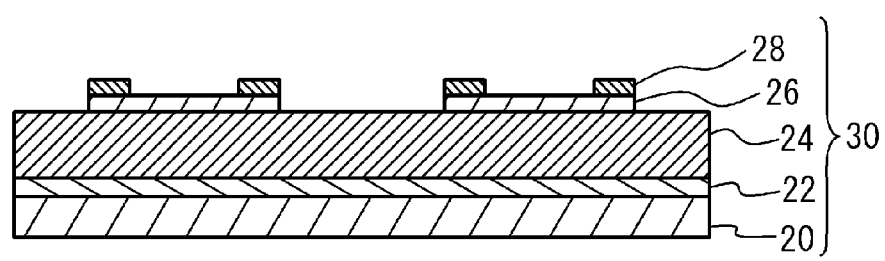

As illustrated in FIG. 1C and FIG. 3C, the frame portion 28 is formed on the metal layer 26. The frame portion 28 is formed so as to surround the region to be the cavity. And, the frame portion 28 is provided along an outer circumference of the metal layer 26. For example, a thermosetting resin is used as the frame portion 28. A thickness of the frame portion 28 is, for example, 10 μm. With the processes, the sheet 30 including the support layer 20, the temporary adhesion layer 22, the resin layer 24, the metal layer 26 and the frame portion 28 is formed.

As illustrated in FIG. 4A, for example, a surface acoustic wave device, an interconnection line 14 and an electrode 15 are formed on a piezoelectric substrate 10 such as LiNbO$_3$ or LiTaO$_3$ with use of a metal film. An IDT or the like of the acoustic wave element is illustrated as the functional portion 12.

Figure 2A:
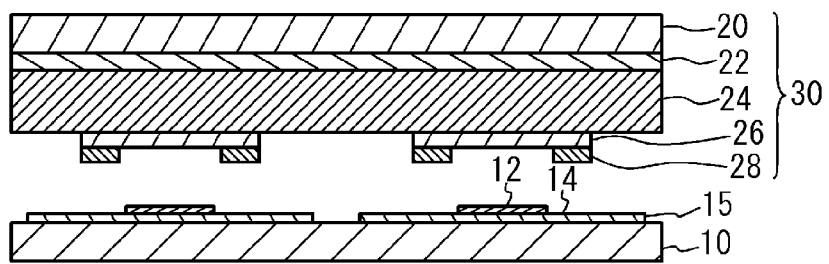
FIG. 2A through FIG. 2E illustrate a cross sectional view of the production method of the electronic component in accordance with the first embodiment.

As illustrated in FIG. 2A and FIG. 4B, the sheet 30 is provided on the substrate 10 so that the metal layer 26 is provided on the functional portion 12 of the acoustic wave element. If the support layer 20 is made of a transparent material such as a glass, it is easy to align the metal layer 26 and the functional portion 12.

Figure 2B:
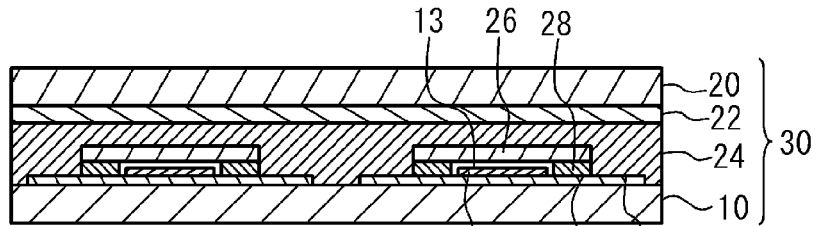

As illustrated in FIG. 2B, the sheet 30 is bonded to the substrate 10 through thermo-compression bonding. For example, the thermo-compression bonding is performed with 2 MPa pressure, in a vacuum atmosphere of 1 kPa vacuum at 300 degrees C. For example, when the resin layer 24 is made of thermoplastic resin, the resin layer 24 is deformed so as to cover the frame portion 28 and the metal layer 26 after the frame portion 28 reaches the substrate 10 (or the interconnection line 14) and pressure and heat are added. A cavity is formed on the functional portion 12 with the frame portion 28 and the metal layer 26. Further, the resin layer 24 is compression-bonded to the substrate 10.

Figure 2C:
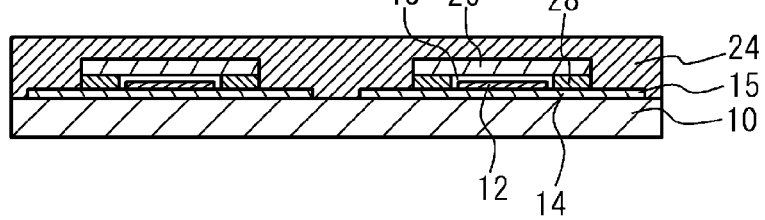

As illustrated in FIG. 2C, the support layer 20 is removed from the temporary adhesion layer 22 by adding heat, radiating ultraviolet rays or the like.

Figure 2D:
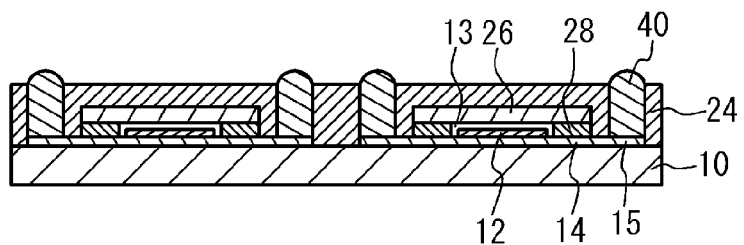

As illustrated in FIG. 2D and FIG. 4C, the resin layer 24 on the electrode 15 is removed, and a terminal portion 40 is formed on the electrode 15. The terminal portion 40 includes a metal such as a solder. The terminal portion 40 penetrates the resin layer 24, and is electrically connected to the functional portion 12 via the interconnection line 14. An etching method such as wet etching can be used for removing the resin layer 24. And, a part of the resin layer 24 can be removed with use of a laser. The terminal portion 40 can be formed by printing a solder or the like on the electrode 15.

Figure 2E:
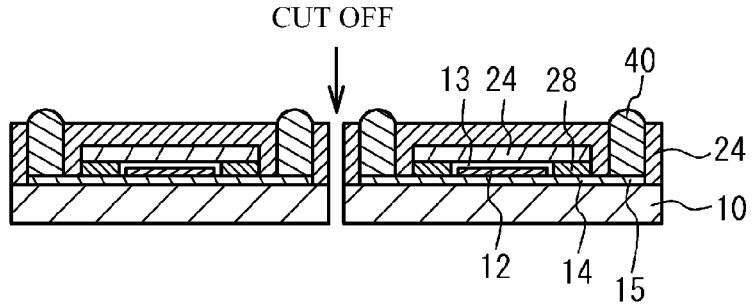

As illustrated in FIG. 2E, the resin layer 24 and the substrate 10 are cut off, and each electronic component is separated from each other. A dicing method or the like can be used for the separating. With the processes, the electronic component in accordance with the first embodiment is manufactured.

In accordance with the first embodiment, as illustrated in FIG. 1A through FIG. 1C, the sheet 30 having the resin layer 24 and the metal layer 26 formed under the resin layer 24 (on the resin layer 24 in FIG. 1A through FIG. 1C) is formed. As illustrated in FIG. 2A and FIG. 4B, the metal layer 26 is arranged on the functional portion 12 on the substrate 10. As illustrated in FIG. 2B, the sheet 30 is bonded to the substrate 10 so that the frame portion 28 surrounding the functional portion 12 is formed between the metal layer 26 and the substrate 10. In this case, the cavity 13 is formed on the functional portion 12 by the metal layer 26 and the frame portion 28.

With the processes, it is restrained that unnecessary gas remains in the cavity 13 and the surface acoustic wave device deteriorates during the formation of the resin layer 24, because a portion acting as a roof of the cavity 13 is the metal layer 26. And, disappearance of the cavity 13 caused by pressure applied by transfer molding during the modularization of the acoustic wave device is restrained, because the portion acting as the roof of the cavity 13 is the metal layer 26.

And, the resin layer 24 includes a thermoplastic resin, and the frame portion 28 includes a thermosetting resin. Thus, the resin layer 24 is easily deformed, and the frame portion 28 gets hardened, when the resin layer 24 is thermo-compression bonded to the substrate 10. Therefore, as illustrated in FIG. 2B, a hollow structure having the cavity 13 can be easily formed. It is restrained that unnecessary gas is introduced into the cavity 13, if the resin layer 24 is thermo-compression bonded to the substrate 10 in a vacuum atmosphere.

Further, as illustrated in FIG. 2D and FIG. 4C, the terminal portion 40 that is electrically connected to the acoustic wave element and penetrates the resin layer 24 is formed out of the metal layer 26 and the frame portion 28. Thus, an upper face of the resin layer 24 can be electrically connected to the acoustic wave element via the terminal portion 40. And, the contact between the terminal portion 40 and the metal layer 26 is restrained, because the terminal portion 40 is formed out of the metal layer 26.

Further, as illustrated in FIG. 1A, the resin layer 24 is formed under the support layer 20 through the temporary adhesion layer 22. As illustrated in FIG. 2C, the support layer 20 is removed from the temporary adhesion layer 22 after the sheet 30 is bonded to the substrate 10. Thus, the resin layer 24 can be bonded to the substrate 10 with the resin layer 24 being supported.

Further, as illustrated in FIG. 1C, the frame portion 28 can be formed under the metal layer 26 during the formation of the sheet 30, in the first embodiment.

A linear thermal expansion coefficient of the metal layer 26 and the resin layer 24 can be approximately 16 ppm/deg C., if Cu is used for the metal layer 26 and liquid crystal polymer is used for the resin layer 24. Thus, it is preferable that the metal layer 26 and the resin layer 24 have the same linear thermal expansion coefficient (a linear thermal expansion coefficient in a planar direction if there is anisotropic aspect). This results in restraining of thermal distortion of the metal layer 26 and the resin layer 24 caused by thermal compression. Similarly, it is preferable that the substrate 10 and the resin layer 24 have the same linear thermal expansion coefficient (a linear thermal expansion coefficient in a planar direction if there is anisotropic aspect).

Second Embodiment

Figure 5A:
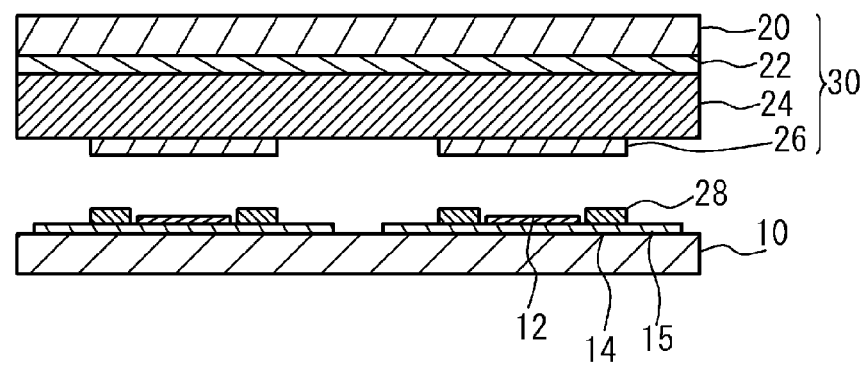
FIG. 5A and FIG. 5B illustrate a cross sectional view illustrating a production method of an acoustic wave device in accordance with a second embodiment.

A second embodiment is an example in which a frame portion is formed on the side of a substrate. FIG. 5A and FIG.

Figure 5B:
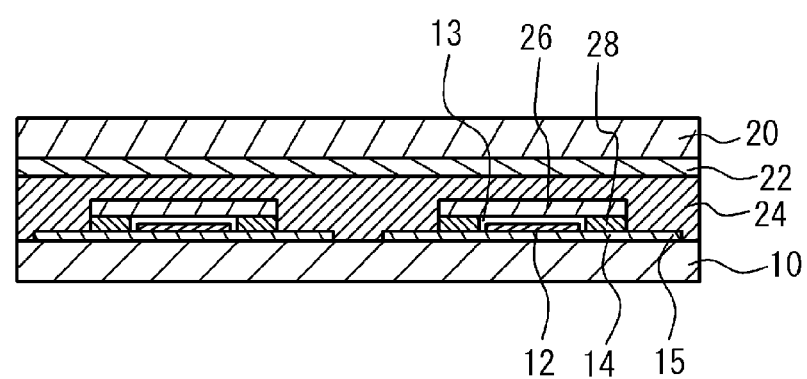

5B illustrate a cross sectional view illustrating a production method of an acoustic wave device in accordance with the second embodiment. As illustrated in FIG. 5A, the frame portion 28 is formed on the substrate 10. As illustrated in FIG. 5B, the sheet 30 is thermo-compression bonded to the substrate 10 as well as FIG. 2B. Other processes are the same as those of the first embodiment. Therefore, the explanation is omitted. The metal layer 26 may be arranged on the frame portion 28 that is formed so as to surround the functional portion 12 on the substrate 10.

Third Embodiment

Figure 6A:
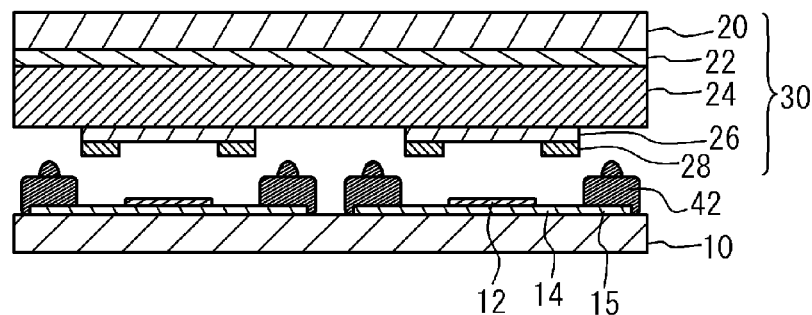
FIG. 6A through FIG. 6D illustrate a cross sectional view illustrating a production method of an electronic component in accordance with a third embodiment.

A third embodiment is an example in which a bump is used. FIG. 6A through FIG. 6D illustrate a cross sectional view illustrating a production method of an electronic component in accordance with the third embodiment. As illustrated in FIG. 6A, for example, a bump is formed on the electrode 15 of the substrate 10, as a terminal portion 42.

Figure 6B:
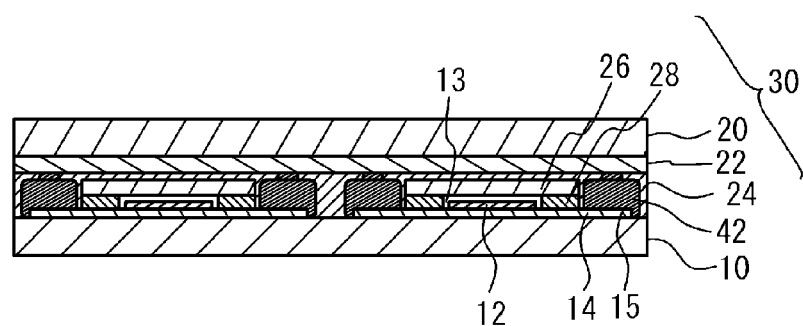

As illustrated in FIG. 6B, the resin layer 24 is deformed so that the terminal portion 42 penetrates the resin layer 24 during bonding the sheet 30 to the substrate 10. A height of the terminal portion 42 is a height allowing that the terminal portion 42 penetrates the resin layer 24 during bonding the sheet 30 to the substrate 10.

Figure 6C:
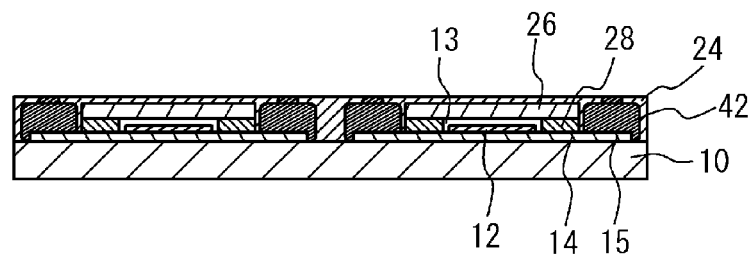
Figure 6D:
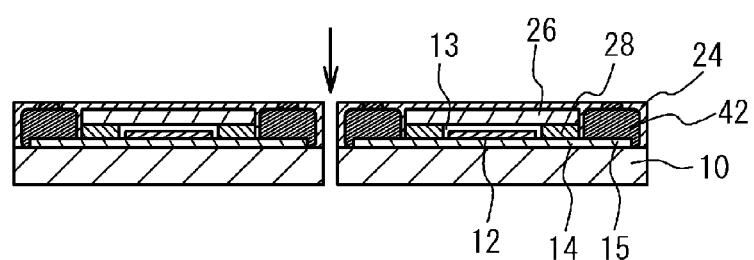

As illustrated in FIG. 6C, the support layer 20 is peeled from the temporary adhesion layer 22. As illustrated in FIG. 6D, each electronic component is separated from each other. Other processes are the same as those of the first embodiment. Therefore, the explanation is omitted.

The terminal portion 42 formed on the substrate 10 may be formed in advance, and the terminal portion 42 may penetrate the resin layer 24 during bonding the sheet 30 to the substrate 10. Thus, it is not necessary to remove the resin layer 24 and form the terminal portion 40 after bonding the sheet 30 to the substrate 10 as in the case of the first embodiment. And, Au using a stud bump or the like or an alloy bump including Au may be used as the terminal portion 42.

Fourth Embodiment

A fourth embodiment is an example in which at least one of terminal portions is bonded to a metal layer. FIG. 7A through FIG. 8D illustrate a cross sectional view illustrating a production method of an electronic component in accordance with the fourth embodiment and correspond to a cross sectional view taken along a line A-A of FIG. 10B. FIG. 9A through FIG. 10B illustrate a top view illustrating the production method of the electronic component in accordance with the fourth embodiment. In FIG. 10B, the functional portion 12, the metal layer 26 and the frame portion 28 are seen through and are illustrated.

Figure 7A:
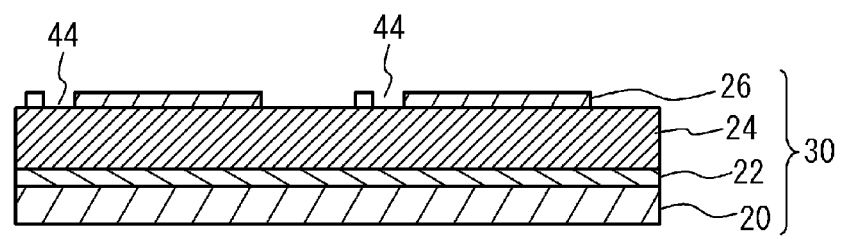
FIG. 7A and FIG. 7B illustrate a cross sectional view illustrating a production method of an electronic component in accordance with a fourth embodiment.
Figure 7B:
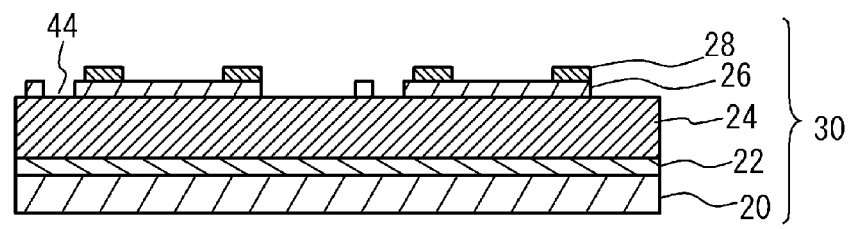
Figure 9A:
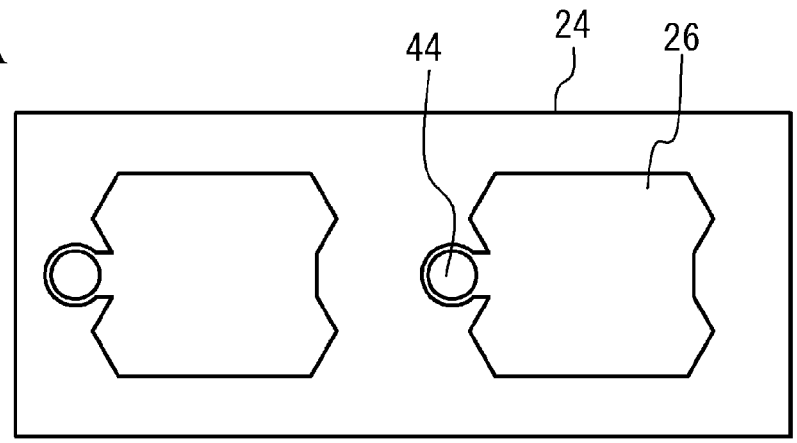
FIG. 9A and FIG. 9B illustrate a top view illustrating the production method of the electronic component in accordance with the fourth embodiment.
Figure 9B:
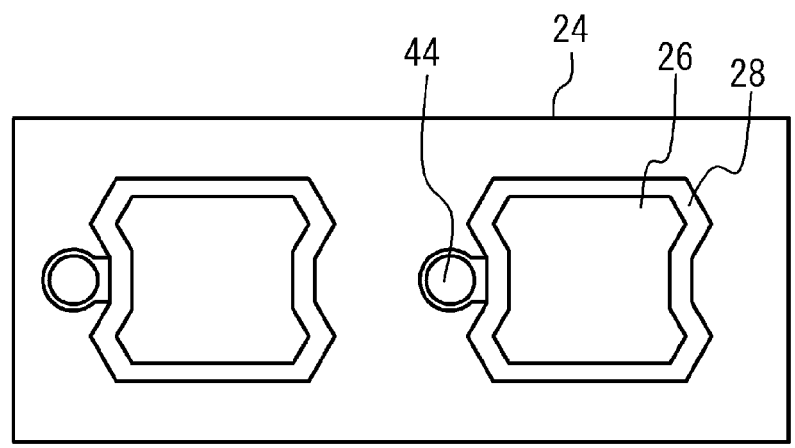

As illustrated in FIG. 7A and FIG. 9A, the metal layer 26 is formed on the resin layer 24. An opening 44 is formed in the metal layer 26 through which the terminal portion 42 penetrates later. As illustrated in FIG. 7B and FIG. 9B, the frame portion 28 is formed on the metal layer 26. The frame portion 28 is formed so that the opening 44 is out of the region surrounded by the frame portion 28.

Figure 8A:
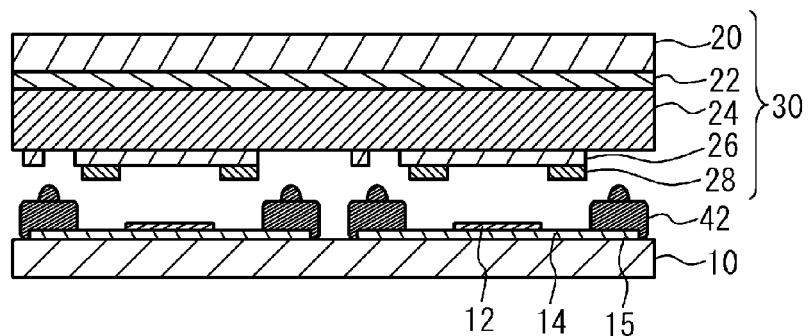
FIG. 8A through FIG. 8D illustrate the cross sectional view illustrating the production method of the electronic component in accordance with the fourth embodiment.
Figure 8B:
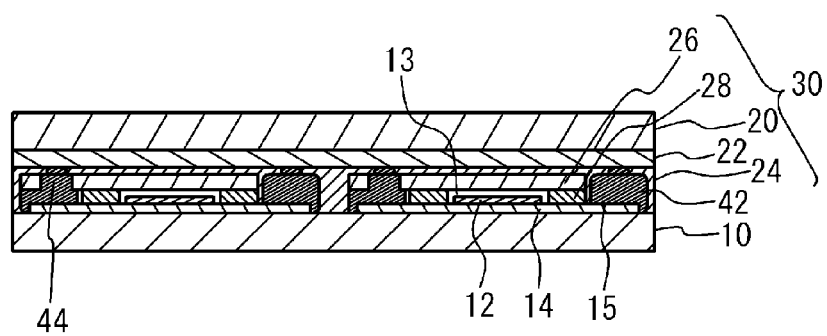
Figure 10A:
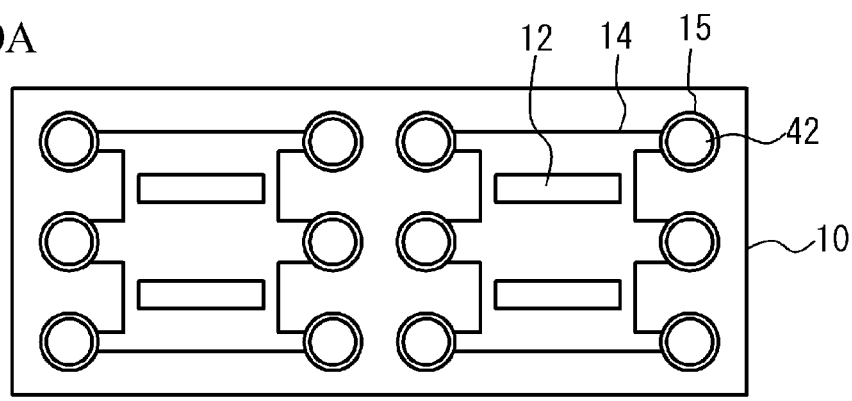
FIG. 10A and FIG. 10B illustrate the top view illustrating the production method of the electronic component in accordance with the fourth embodiment.
Figure 10B:
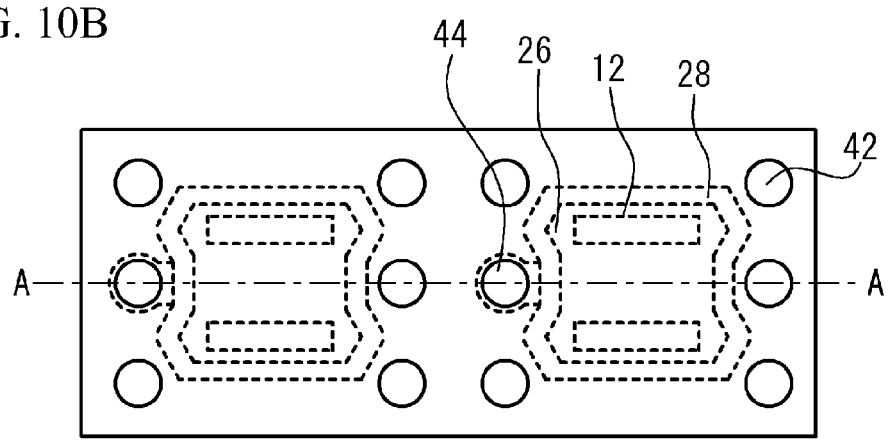

As illustrated in FIG. 10A, the terminal portion 42 is formed on the electrode 15. As illustrated in FIG. 8A, the metal layer 26 is arranged on the functional portion 12 so that the opening 44 of the metal layer 26 is positioned on at least one of the terminal portions 42. As illustrated in FIG. 8B, at least one of the terminal portions 42 penetrates the opening 44 of the metal layer 26, and the metal layer 26 is electrically connected to the terminal portion 42, during bonding the sheet 30 to the substrate 10.

Figure 8C:
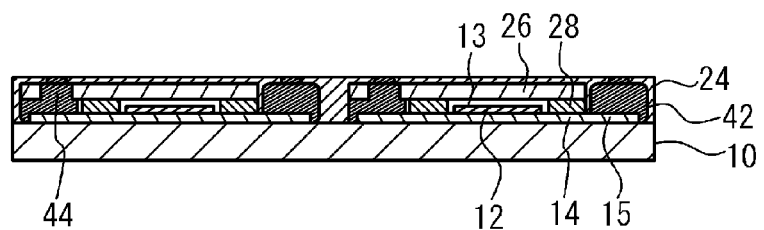
Figure 8D:
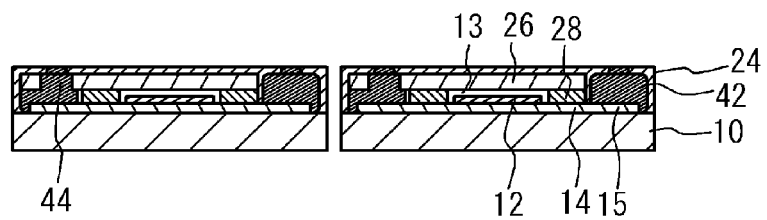

As illustrated in FIG. 8C and FIG. 10B, the support layer 20 is peeled from the temporary adhesion layer 22. As illustrated in FIG. 8D, each electronic component is separated from each other. Other processes are the same as those of the third embodiment. Therefore, the explanation is omitted.

In accordance with the fourth embodiment, as illustrated in FIG. 8B, the metal layer 26 is arranged on at least one of the terminal portions 42, and the metal layer 26 is electrically connected to the at least one of the terminal portions 42, during bonding the sheet 30 to the substrate 10. Thus, the metal layer 26 is capable of having the same electric potential (for example, ground potential) as the terminal portion 42.

And, the metal layer 26 is electrically connected to at least one of the terminal portions 42 during bonding the sheet 30 to the substrate 10, by making an edge of the at least one of the terminal portions 42 penetrate the opening 44. Thus, with a simple process, the terminal portion 42 penetrates the resin layer 24, and at least one of the terminal portions 42 is electrically connected to the metal layer 26.

Further, as illustrated in FIG. 10B, the single cavity 13 formed by the metal layer 26 and the frame portion 28 may be formed on a plurality of functional portions 12.

Fifth Embodiment

Figure 11A:
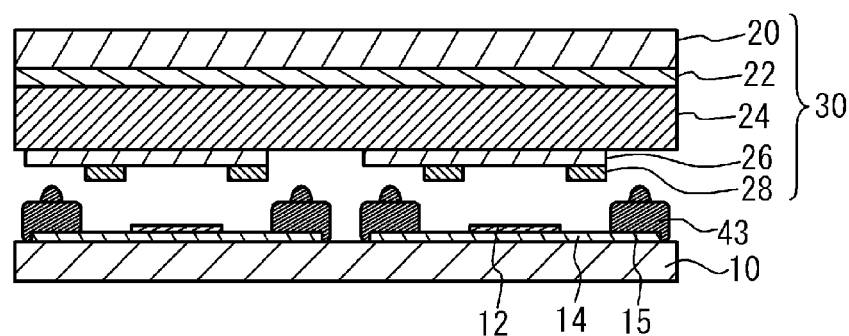
FIG. 11A through FIG. 11E illustrate a cross sectional view illustrating a production method of an electronic component in accordance with a fifth embodiment.
Figure 11B:
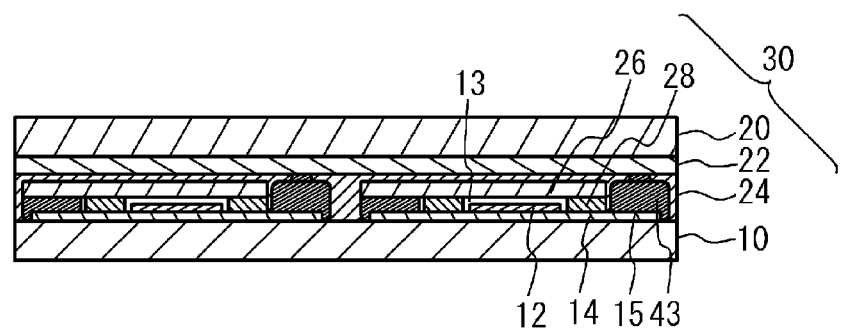
Figure 11C:
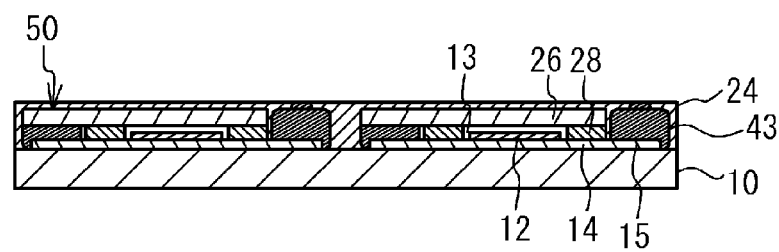

A fifth embodiment is an example in which a terminal portion is formed through two divided processes. FIG. 11A through FIG. 11E illustrate a cross sectional view illustrating a production method of an electronic component in accordance with a fifth embodiment. As illustrated in FIG. 11A, the metal layer 26 does not have an opening, being different from the fourth embodiment. A lower terminal portion 43 is formed on the electrode 15. The lower terminal portion 43 is a bump or the like, and is an Au bump or the like. As illustrated in FIG. 11B, an edge of at least one of the lower terminal portions 43 is crushed by the metal layer 26 during bonding the sheet 30 to the substrate 10. The lower terminal portions 43 other than the lower terminal portion 43 of which edge is crushed by the metal layer 26 penetrate the resin layer 24. It is not always necessary for the lower terminal portion 43 to penetrate the resin layer 24. As illustrated in FIG. 11C, the support layer 20 is removed from the temporary adhesion layer 22.

Figure 11D:
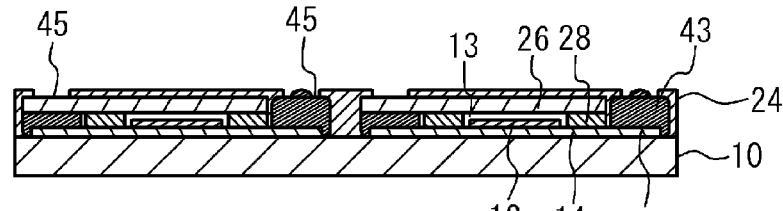
Figure 11E:
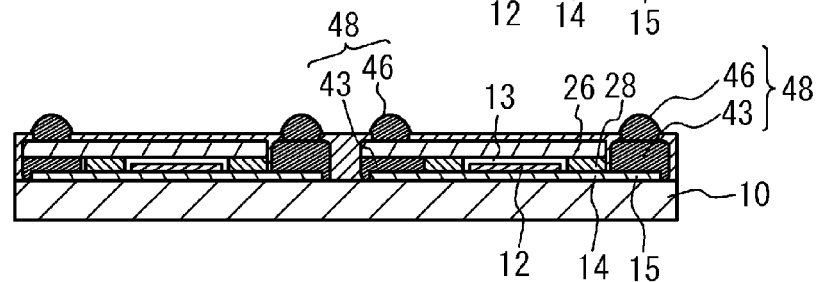

As illustrated in FIG. 11D, an opening 45 is formed in the resin layer 24 so that a part of the upper face of the metal layer 26 and an upper face of the lower terminal portion 43 are exposed. The opening 45 is formed by removing the resin layer 24 through an etching process such as wet etching or laser-light radiating. As illustrated in FIG. 11E, an upper terminal portion 46 is formed in the opening 45. The upper terminal portion 46 is, for example, formed by printing a metal such as a solder. Thus, a terminal portion 48 penetrating the resin layer 24 is formed by the lower terminal portion 43 and the upper terminal portion. And, at least one of the upper terminal portions 46 is electrically connected to the metal layer 26.

In accordance with the fifth embodiment, the metal layer 26 is electrically connected to at least one of the terminal portions 48 by compression-bonding an edge of at least one of the lower terminal portions 43 to the metal layer 26 during bonding the sheet 30 to the substrate 10. Thus, the process of forming an opening in the metal layer 26 can be omitted as well as the fourth embodiment.

And, the terminal portion 48 that penetrates the resin layer 24 and is formed by the lower terminal portion 43 and the upper terminal portion 46 is formed, by forming the upper terminal portion 46 on the lower terminal portion 43. Further, the metal layer 26 is electrically connected to at least one of the terminal portions 48 by forming the upper terminal portion 46 contacting with a part of the upper face of the metal layer 26. Thus, the terminal portion 48 is capable of having a two-layer structure of the upper terminal portion 46 and the lower terminal portion 43. Further, the terminal portion 48 can be electrically connected to the metal layer 26 via the upper terminal portion 46.

In the first embodiment to the fifth embodiment, the surface acoustic wave element is described as an acoustic wave element. However, a thin-film piezoelectric resonance element may be used as the acoustic wave element. In this case, the functional portion is a portion in which an upper electrode and a lower electrode are laminated and sandwich a piezoelectric thin film.

The embodiments of the present invention have been described. The present invention is not limited to these specific embodiments but may be varied or changed within the scope of the claimed invention.

What is claimed is:

1. A production method of an electronic component, comprising:
    forming a sheet having a resin layer and a metal layer formed under the resin layer;
    bonding the sheet to a substrate so that the metal layer is arranged above a functional portion of an acoustic wave element formed on the substrate, a frame portion surrounding the functional portion is formed between the metal layer and the substrate, a cavity is formed on the functional portion by the metal layer and the frame portion, and the resin layer covers the metal layer and the frame portion; and
    forming one or more terminal portions outside of the frame portion, at least one of the one or more terminal portions penetrating the resin layer, at least one of the one or more terminal portions being electrically connected to the acoustic wave element,
    wherein the bonding of the sheet to the substrate includes arranging the metal layer on at least one of the one or more terminal portions to electrically connect the metal layer and the at least one of the terminal portions.

2. The production method as claimed in claim 1, wherein:
    the resin layer includes a thermoplastic resin;
    the frame portion includes a thermosetting resin; and
    the bonding of the sheet to the substrate includes thermocompression bonding the resin layer to the substrate.

3. The production method as claimed in claim 1, wherein in the bonding of the sheet to the substrate, the metal layer is electrically connected to the at least one of the one or more terminal portions by making an edge of the at least one of the terminal portions penetrate an opening formed in the metal layer.

4. The production method as claimed in claim 1, wherein in the bonding of the sheet to the substrate, the metal layer is electrically connected to the at least one of the one or more terminal portions by pressure-bonding an edge of at the least one of the terminal portions to the metal layer.

5. The production method as claimed in claim 4 further comprising:
    forming an upper terminal portion over at least one of the one or more terminal portions,
    wherein the metal layer is electrically connected to the upper terminal portion by forming the upper terminal portion contacting with a part of an upper face of the metal layer.

6. The production method as claimed in claim 1, wherein:
    the forming of the sheet includes forming the resin layer under a support layer through a temporary adhesion layer; and
    the production method further comprises removing the support layer from the temporary adhesion layer after bonding the sheet to the substrate.

7. The production method as claimed in claim 1, wherein the forming of the sheet includes forming the frame portion under the metal layer.

* * * * *